(12) United States Patent
Prejbeanu et al.

(10) Patent No.: US 7,898,833 B2
(45) Date of Patent: Mar. 1, 2011

(54) MAGNETIC ELEMENT WITH THERMALLY-ASSISTED WRITING

(75) Inventors: Lucian Prejbeanu, Sassenage (FR);
Cécile Maunoury, Grenoble (FR);
Bernard Dieny, Lans en Vercors (FR);
Clarisse Ducruet, Grenoble (FR);
Ricardo Sousa, Grenoble (FR)

(73) Assignee: Commissariat A l' Energie Atomique, Paris (FR)

( * ) Notice: Subject to any disclaimer, the term of this patent is extended or adjusted under 35 U.S.C. 154(b) by 189 days.

(21) Appl. No.: 12/269,918

(22) Filed: Nov. 13, 2008

(65) Prior Publication Data

US 2009/0147392 A1 Jun. 11, 2009

Related U.S. Application Data

(60) Provisional application No. 61/034,584, filed on Mar. 7, 2008.

(30) Foreign Application Priority Data

Dec. 5, 2007 (FR) .................................. 07 59584

(51) Int. Cl.
*G11C 15/02* (2006.01)
(52) U.S. Cl. ........................................ 365/50; 365/173
(58) Field of Classification Search .................. 365/50, 365/173
See application file for complete search history.

(56) References Cited

U.S. PATENT DOCUMENTS 4,949,039 A 8/1990 Grünberg
5,159,513 A 10/1992 Dieny et al.
5,343,422 A 8/1994 Kung et al.
5,583,725 A 12/1996 Coffey et al.
5,640,343 A 6/1997 Gallagher et al.
6,021,065 A 2/2000 Daughton et al.
6,385,082 B1 5/2002 Abraham et al.
2006/0141640 A1* 6/2006 Huai et al. ..................... 438/3
2006/0152967 A1 7/2006 Nickel

FOREIGN PATENT DOCUMENTS

EP 1 486 967 A2 12/2004
EP 1 693 854 A2 8/2006

* cited by examiner

*Primary Examiner*—Michael T Tran
(74) *Attorney, Agent, or Firm*—Burr & Brown

(57) ABSTRACT

A magnetic element with thermally-assisted writing using a field or spin transfer provided, including a magnetic reference layer referred to as the "trapped layer," the magnetization of which is in a fixed direction, and a magnetic storage layer called the "free layer" having a variable magnetization direction and consisting of a layer made of a ferromagnetic material with magnetization in the plane of the layer and magnetically coupled to a magnetization-trapping layer made of an antiferromagnetic material. A semiconductor or an insulating layer with confined-current-paths is sandwiched between the reference layer and the storage layer. At least one bilayer, consisting respectively of an amorphous or quasi-amorphous material and a material having the same structure or the same crystal lattice as the antiferromagnetic layer, is provided in the storage layer between ferromagnetic layer, which is in contact with the semiconductor or insulating layer with confined-current-paths, and antiferromagnetic layer.

11 Claims, 2 Drawing Sheets

MAGNETIC ELEMENT WITH THERMALLY-ASSISTED WRITING

CROSS REFERENCE TO RELATED APPLICATION

This application claims the benefit of French Application No. 07.59584, filed Dec. 5, 2007, the entirety of which is incorporated herein by reference.

FIELD OF THE INVENTION

The present invention relates to the field of magnetic tunnel junction or magnetic spin-valve elements such as those used in non-volatile magnetic random-access memories which can be used, in a known manner, to store, read and write data in electronic systems. More specifically, it applies to magnetic random-access memories, commonly referred to by the abbreviation "MRAM", which consist of a number of storage cells each formed by a Magnetic Tunnel Junction, which is usually referred to by the abbreviation "MTJ". Relatedly, the present invention also relates to logic elements with magnetic layers if they use at least one magnetic tunnel junction or spin valve.

In the text which follows, the term "magnetic element" is taken to mean a stack of magnetic layers comprising at least one trapped layer, a free layer and, between them, an insulating or semiconductor layer or insulating layer with confined-current-paths. The terms "trapped layer" and "free layer" will be defined more precisely in the description which follows.

BACKGROUND OF THE INVENTION

There has been renewed interest in MRAM memories due to the development of Magnetic Tunnel Junctions (MTJs) which have high magnetoresistance at ambient temperature. These magnetic random-access memories have many significant advantages:
- speed comparable to that of SRAM (read and write operations take a few nanoseconds),
- density comparable to that of DRAM,
- non volatile, like FLASH memory,
- no read/write fatigue,
- insensitive to ionising radiation, a problem which is becoming increasingly acute due to the reduced dimensions of elementary transistors.

This being so, they are increasingly replacing memory that uses more conventional technology based on the charge state of a capacitor (DRAM, SRAM, FLASH) and are becoming a universal memory.

The first magnetic memories that were produced consisted of a number of storage cells each consisting of an element having so-called "giant magnetoresistance" and consisting of a stack of several alternatively magnetic and non-magnetic metallic layers.

A description of this type of structure can be found, for example, in Documents U.S. Pat. No. 4,949,039 and U.S. Pat. No. 5,159,513 which deal with the basic structure and in Document U.S. Pat. No. 5,343,422 which deals with implementation of a random-access memory (RAM) based on these basic structures.

Because of its architecture, this technology makes it possible to produce non-volatile memories using technology that is simple but which has a limited capacity. The fact that the storage cells are connected in series along each line limits possible integration because the signal becomes weaker and weaker as the number of cells increases.

The development of Magnetic Tunnel Junction (MTJ) storage cells has made it possible to achieve significant improvement in the performance and method of functioning of these memories. Such magnetic tunnel junction memories are described, for instance, in Document U.S. Pat. No. 5,640,343. In their simplest forms, they comprise two magnetic layers of different coercivity separated by a thin insulating layer. When the magnetizations of the storage and reference layers respectively which constitute the above-mentioned magnetic layers located either side of the tunnel barrier are antiparallel, the resistance of the magnetic tunnel junction is high. Conversely, when the magnetizations are parallel, this resistance becomes low.

These two magnetic layers are preferably based on 3d metals (Fe, Co, Ni) and alloys thereof (likely to contain boron or zirconium so as to make the structure of said layers amorphous and flatten their interfaces) and the insulating layer conventionally consists of amorphous alumina ($AlO_x$) or crystalline magnesium oxide (MgO). Advantageously, the reference layer, which is also referred to as the "trapped layer", may itself consist of a stack of several layers such as that described, for instance, in Document U.S. Pat. No. 5,583,725, in order to provide a so-called Synthetic Anti-Ferromagnetic (SAF) layer. Similarly, it is possible to replace each of the single storage cells of the magnetic tunnel junction by a dual magnetic tunnel junction such as that described, for example, in the Publication Y. SAITO & al, *Journal of Magnetism and Magnetic Materials>>*, Volume 223, 2001, page 293.

In this case, the storage layer is placed between two insulating layers with the structure comprising two reference layers positioned on the faces opposite the said respective insulating layers.

The most classic architecture, referred to as "FIMS" (Field Induced Magnetic Switching), i.e. reversal of magnetizations by an induced magnetic field, is described in Document U.S. Pat. No. 6,021,065 and in the Publication "*Journal of Applied Physics*" vol. 81, 1997, page 3758 and is shown in FIG. 1.

As can be seen in FIG. 1 which shows the prior art, each storage cell (10) consists of a CMOS transistor (12) associated with a magnetic tunnel junction MTJ (11). Said tunnel junction (11) comprises at least one magnetic layer (20) referred to as the "storage layer" or "free layer", a thin insulating layer (21) and a magnetic layer (22) referred to as the "trapped layer" or "reference layer".

The operation of these magnetic memories with storage cells each consisting of a magnetic tunnel junction involves, at the time of a write, generating an impulsive magnetic field produced by current lines or conductors associated with each of said magnetic cells.

Thus, in the context of an FIMS architecture, there are three current line levels. In FIG. 1, the two line levels (14) (Word line) and (15) (Bit line), generally arranged at 90° relative to each other, are designed to generate magnetic field pulses which make it possible to switch the magnetization of free layer (20) during the write process. These magnetic field pulses are produced by passing brief electrical pulses having a typical duration of 2 to 5 ns and an intensity of the order of several milliamps (mA) through current lines (14) and (15). The intensity of these pulses and their synchronization are adjusted so that only the magnetization of the storage cell located at the cross-point of these two current lines is capable of switching.

An additional current line level (16), also referred to as a "Control line" is designed to control opening or closing of the selection or switching transistor (12) channel associated with each storage cell in order to be able to address each storage cell individually. In other words, CMOS transistors (12) are used as switches.

When writing the memory cell in question, the selected transistor (12) is blocked or OFF and therefore no current flows through the transistor. A current pulse I is sent through the two current lines (14) and (15) which correspond to the selected storage cell (10). The amplitude of current pulse I is such that the magnetic field created is not sufficient to switch the storage cells on lines (14) or (15), except at the cross-point of lines (14) and (15) where the joint contribution of the two lines is sufficient to generate a magnetic field which is sufficient and capable of switching the magnetization of layer (20) of the storage cell in question.

In read mode, transistor (12) is in saturated mode or ON because a positive current pulse is applied to the gate of said transistor via control line (16) and the current which flows is maximal. A test current is then sent through current line (14) and this can only pass through the storage cell whose transistor (12) is in saturated mode or ON. This current is used to measure the resistance of the magnetic tunnel junction (11) of said selected storage cell (10). Compared with a reference storage cell (not shown), it is then possible to determine the corresponding state of storage cell (10)—"0" (for a configuration with parallel low-resistance magnetization) or "1" (for a configuration with antiparallel high-resistance magnetization).

From the above explanations, it is apparent that the intensity of the pulses that flow through current lines (14) and (15) and their synchronization are adjusted so that only the magnetization of the storage cell located at the cross-point of these two current lines (selected cell) can switch due to the effect of the magnetic field generated by the two conductors. The other storage cells located on the same row or same column (half-selected elements) are in fact only subjected to the magnetic field of one of the conductors (14, 15) and consequently do not reverse.

Given the nature of the mechanism for writing these storage cells, the limits of this architecture are readily apparent.

Because writing is obtained using an external magnetic field, writing is subject to the value of the individual reversal field of each storage cell. Since the distribution function of the reversal fields for all the storage cells is wide (in fact it is not uniform because of fabrication constraints and inherent statistical fluctuations), the magnetic field at the selected storage cell must exceed the highest reversal field in the statistical distribution, at the risk of inadvertently reversing certain storage cells located on the corresponding row or column, where the reversal field in the lower part of the distribution is weaker than the magnetic field generated by the row or column alone. In addition, the power consumption of a memory which uses such an external magnetic field will be higher, the wider the distribution of the reversal field.

Moreover, given the fact that, generally speaking, the average value of the reversal field increases as the size of storage cells decreases and cell size tends to decrease in order to save space, future product generations are likely to require even higher currents. Consequently, the more highly integrated these memories are, the more power they require in order to operate.

Another drawback of these prior-art memories is the stability of the magnetization of the free layer with respect to thermal fluctuations as the size of the storage cell decreases. In fact, the energy barrier that must be overcome in order to switch the magnetization of this layer from one orientation to another is proportional to the volume of this layer. As this volume reduces, the height of the barrier then becomes comparable to thermal agitation. Information written in the memory is then no longer preserved. To overcome this difficulty, one is forced to increase the magnetic anisotropy of the free layer by selecting a material with higher anisotropy or by enhancing the anisotropy of the storage cell for example. But doing this increases the magnetic field which is required in order to obtain magnetic switching and hence also increases the power consumed in order to generate the field required to obtain magnetic switching. The current in the word line and bit line may, in certain cases, even exceed the limiting threshold imposed by electromigration in these conductive lines (typically of the order of $10^7$ A/cm$^2$).

Also, in order to overcome this problem, the use of magnetic random-access memories, with thermally-assisted switching (TAS), often referred to by the abbreviation TAS-MRAM, in which the free layer or reference layer is itself trapped by an antiferromagnetic layer, has been proposed. This improvement is, for example, described in Document U.S. Pat. No. 6,385,082.

In this configuration, rather than achieving memory-cell write selectivity by combining two perpendicular magnetic field pulses, write selectivity is obtained by combining a brief increase in the temperature of the storage cell to be addressed, produced by a current pulse which flows through said storage cell in question, by using either a magnetic field pulse or by spin transfer obtained by passing a spin-polarised current through the storage layer of said storage cell.

Such a configuration is shown in FIG. 2. In this Figure, free layer (40) of magnetic tunnel junction (31) is trapped by antiferromagnetic layer (41). In the same way as in the case of FIMS memories, an insulating layer (42) is sandwiched between magnetic free layer (40) and magnetic layer (43) referred to as the "trapped layer". In this configuration, the two magnetic layers are advantageously made of 3d transition metals (Fe, Co, Ni) and alloys thereof, undoped or doped (especially with boron) and the insulating layer can be made of alumina or magnesium oxide. In one advantageous version, the trapped magnetic layer (43) is coupled with antiferromagnetic layer (44), the function of which is to trap layer (43) so that its magnetization does not switch at the time of a write.

Here also, antiferromagnetic layer (44) can be a synthetic antiferromagnetic layer consisting of several layers.

In this configuration, antiferromagnetic layer (41) has a so-called "blocking" (limit) temperature $T_B$ above which the so-called stabilising "exchange" magnetic field which it exerts on layer (40) is no longer effective on free layer (40). The material of which antiferromagnetic layer (41) is made and its thickness are selected so that the blocking temperature $T_B$ exceeds the temperature at which the memory is used (standby operating temperature). Similarly, the blocking temperature $T_B$ of antiferromagnetic layer (44) adjacent to trapped layer (43) is selected so that it exceeds and is quite different to the blocking temperature of antiferromagnetic layer (41).

Thus, at temperatures below the blocking temperature of antiferromagnetic layer (41), free layer (40) is stabilised by the exchange magnetic field and it is therefore very difficult to reverse its magnetization simply by applying an external magnetic field or spin transfer obtained by passing spin-polarised current through the free layer. At the blocking temperature of antiferromagnetic layer (41) and above this temperature, because the exchange field is zero, it then becomes very easy to reverse the magnetization of free layer (40) by means of an external magnetic field, provided that the latter exceeds the coercive field strength of the free layer (40) at a given temperature or by using spin transfer by passing spin-polarised current of sufficiently high density through the free layer to cause magnetic switching. Because of this, for free layer (40), one chooses a material which allows the free layer to have a weak coercive field strength if switching is obtained by a magnetic field or a low critical switching current density if switching is obtained by spin transfer.

This particular architecture comprises two or three current line levels depending whether switching is obtained by spin transfer or by magnetic field. To obtain writing using a magnetic field, a so-called "field line" current line (30) is placed underneath magnetic tunnel junction (31) without actually being in contact with the latter. This line is intended to generate the magnetic field required in order to reverse free storage layer (40) when an electric current of several milliamps (mA) flows through it. There is no such line if switching is obtained by spin transfer. There is another current line (32) referred to as the "bit line" above magnetic tunnel junction (31) of the storage cell in question and in contact with the latter. A third current line (33), referred to as the "word line", is in contact, through a via (34), with a CMOS transistor (35), the "word line" of which constitutes the gate. Similarly, for FIMS, the word line controls opening or closing of the transistor channel over the entire length by applying or not applying a threshold voltage, with each of the transistors operating as a switch for each of the associated storage cells.

In read mode, the CMOS transistor (35) associated with the storage cell that is to be read is closed by applying a sufficient voltage in word line (33). Bit line (32) then sends a test current which can only flow through the sole storage cell whose transistor (35) is closed (conducting). This current is used to measure the resistance of the magnetic tunnel junction (31) of the selected storage cell. The corresponding state of the storage cell—"1" or "0"—is thus determined by comparison with a reference storage cell (not shown) with the "1" state corresponding, for example, to maximum resistance and the "0" state corresponding to minimum resistance.

In write mode, the CMOS transistor (35) of the storage cell that is to be written is closed by applying a sufficient voltage in word line (33). A heating current having an intensity greater than the test current is then sent to the storage cell to be written by bit line (32). Above a certain current density, the current causes the temperature of magnetic tunnel junction (31) to rise above the blocking temperature of antiferromagnetic layer (41). The exchange field which stabilises free layer (40) then becomes zero and said free layer is then very unstable. To obtain magnetic switching using a magnetic field, an electric pulse of several milliamps (mA) having a duration of several nanoseconds is then sent through field line (30) once the blocking temperature is reached (after several nanoseconds). This pulse generates a magnetic field which is sufficient to reverse free layer (40) in the desired direction (to write a "1" or a "0" bit) because, as described above, this free layer (40) is very unstable with weak intrinsic coercivity. Once free layer (40) has been written, the electric current in field line (30) is switched off, the write magnetic field becomes zero and the heating current in magnetic tunnel junction (31) is then switched off (by switching off the current in bit line (32) and opening transistor (35)). The overall temperature of the storage cell then drops very rapidly (several nanoseconds) below the blocking temperature of antiferromagnetic layer (41) (typically to the standby operating temperature) and the exchange field then returns to its initial value and, as a result, stabilises free layer (40).

To obtain switching by spin transfer, one uses the heating current to both heat the storage layer of the tunnel junction and to apply spin transfer-torque to the magnetization of said layer. To make the magnetization of the storage layer switch, the heating-current electrons must flow from the reference layer to the storage layer and this means that the heating current must flow from the storage layer to the reference layer. Conversely, to make the magnetization of the storage layer switch to the antiparallel state, the heating-current electrons must flow from the storage layer to the reference layer and this means that the heating current must flow from the reference layer to the storage layer.

Such magnetic memories with thermally-assisted writing have a certain number of advantages which include:
- considerable improvement in write selectivity because only the storage cell that is to be written is heated;
- information written to the memory is preserved even when the storage cell is exposed to stray magnetic fields at ambient temperature;
- improved thermal stability of information thanks to the use of materials with high magnetic anisotropy (intrinsic anisotropy and anisotropy due to the shape of the storage cell or the exchange anisotropy field of the storage layer) at ambient temperature;
- possibility of significantly reducing the size of storage cells without thereby affecting their stability limit by using materials having high magnetic anisotropy at ambient temperature or having a storage layer trapped by exchange anisotropy;
- reduced power consumption at the time of a write;
- possibility of obtaining multi-level storage cells in certain circumstances.

It has also been demonstrated that this technology can be used to implement logic elements such as reprogrammable logic gates (see, for example, the Publication "Evaluation of a non-volatile FPGA based on MRAM technology" by Zhao-W; Belhaire-E; Javerliac-V; Chappert-C; Dieny-B, Proceedings. 2006 International Conference on Integrated Circuit Design and Technology. 2006: 4 pp, IEEE, Piscataway, N.J., USA). These logic elements also combine CMOS semiconductor components with magnetic tunnel junctions such as the MRAMS described above. Unlike memories whose purpose is to store information, these logic elements are used to process information and to perform logic operations on information. Magnetic tunnel junctions are often used in these elements as variable resistors which make it possible to change the switching thresholds of CMOS circuits.

The object of the present invention relates to both MRAMS with thermally-assisted writing and such logic elements in which the magnetic configurations of tunnel junctions are modified by writing by using a field or spin transfer with thermal assistance.

Notwithstanding these advantages, one is nevertheless confronted with certain difficulties in terms of fabrication technology.

In the context of magnetic memories with thermally-assisted writing which use magnetic tunnel junctions having an insulating layer based on alumina, one uses an alloy based on manganese, especially IrMn and FeMn, as an antiferromagnetic layer intended to trap the storage layer. Using such a layer has no effect on the magnetoresistance ratio. This result is chiefly due to the inherently amorphous nature of the alumina which constitutes the tunnel barrier of the magnetic tunnel junction. This amorphous nature is preserved after the annealing phase required for the stack thus produced, annealing being necessary in order to give the polarising exchange field at the interface between the antiferromagnetic magnetization-trapping layer and the ferromagnetic reference layer a predefined orientation. This amorphousness has no effect on the texture of the upper antiferromagnetic layer (IrMn) for generating a high exchange anisotropy field. In fact, the magnetoresistance value of a magnetic tunnel junction based on alumina is not affected by using such an upper antiferromagnetic layer.

However, the situation is totally different if one uses magnetic tunnel junctions based on crystalline or textured magnesium oxide.

Firstly, the reader is reminded that using a magnetic tunnel junction which utilises a tunnel barrier based on magnesium oxide makes it possible to improve magnetoresistance amplitudes significantly. It has been demonstrated that this improvement is inherent in the crystal structure of the MgO tunnel barrier and the adjacent ferromagnetic layers. Both the MgO tunnel barrier and the adjacent ferromagnetic layers must be monocrystalline or highly textured with a body-centred cubic crystallographic arrangement (001) so that there can be a symmetrical spin-dependent filtering effect across the tunnel barrier. This way, one obtains magnetoresistance ratios well in excess of 100% at ambient temperature using magnetic tunnel junctions in which one uses:

body-centred cubic Fe, Co or CoFe ferromagnetic layers;
or textured junctions which include also body-centred cubic polycrystalline CoFe or Co ferromagnetic layers
or a CoFeB/MgO/CoFeB stack with deposited amorphous CoFeB.

In the latter case, the MgO tunnel barrier grows with a highly-oriented body-centred cubic texture at the level of its interface with the lower amorphous CoFeB layer. The thermal annealing process performed after depositing the stack is required in order to bring about local recrystallisation with body-centred cubic crystal orientation of the magnetic layers which are in contact with the MgO tunnel barrier. At the same time, annealing fixes the exchange magnetic field which polarises the reference layer.

As a result of these observed differences, spin-dependent magneto-transport properties also differ, depending whether the magnetic tunnel junction is based on alumina or magnesium oxide. Spin filtering based on the symmetry of electronic wave functions which are characteristic of a textured crystal structure of the tunnel barrier and the adjacent ferromagnetic layers produces higher magnetoresistance values. This filtering is also more sensitive to structural disparities between the various layers of the stack. In the specific case of magnetic tunnel junctions with a tunnel barrier made of MgO, depositing a MgO tunnel barrier having a body-centred cubic crystal structure also involves growing an upper ferromagnetic layer with an identical crystal structure so as to ensure a high TMR value based on the effect of electrons being filtered by the tunnel barrier spin-dependently.

As stated earlier, in cases where a storage layer which is polarised by an exchange field is used for magnetic memories with thermally-assisted writing, one must deposit an antiferromagnetic layer with a low blocking temperature on the upper face of said storage layer. Usually, this antiferromagnetic layer is organised with a body-centred cubic crystal structure in order to obtain a high polarising exchange field. This being so, one comes up against the problem of crystallographic incompatibility between the two types of structures required respectively for the tunnel barrier and for the upper antiferromagnetic layer and which has negative effects on the magnetoresistance ratio and on the exchange anisotropy of the storage layer.

Because of this, one is confronted by the difficulty of achieving coexistence of the following in a trilayer stack: MgO lower ferromagnetic layer/tunnel barrier/upper magnetic layer having a high magnetoresistance ratio and body-centred cubic structure with an upper bilayer constituting the ferromagnetic/antiferromagnetic storage layers with a high exchange anisotropy field obtained with a face-centred cubic structure, even though both these entities have a different preferential crystallographic structure.

It goes without saying that, although the above discussion is based on cases involving magnetic tunnel junctions which presuppose the presence of a tunnel barrier which separates the reference layer from the storage layer, the same problems of adapting the crystallographic structures are encountered in cases where semiconductor separation layers (for instance germanium, silicon or GaAs) or metal/heterogeneous oxide separation layers such as so-called confined-current-paths layers, developed in the context of magnetoresistive read heads for hard disks, are used. The latter are prepared, for example, by oxidising thin layers of $Al_{1-x}Cu_x$ alloys where x is 0.5 to 10%.

SUMMARY OF THE INVENTION

The object of the present invention is to propose precisely such random-access magnetic memories or logic elements with thermally-assisted writing using a field or spin transfer and, more especially, using, as a storage cell, a magnetic tunnel junction having a tunnel barrier made of MgO because of its magnetic characteristics and, in particular, in order to simultaneously obtain high magnetoresistance efficiency and good trapping of the storage layer.

To achieve this, one must obtain the following various characteristics for the stack which constitutes the magnetic tunnel junction:

low blocking temperature and high magnetic exchange field for the storage layer, at least greater than the coercive field strength of said storage layer;

two clearly-separated blocking temperature distributions for the storage layer and the reference layer respectively;

high magnetoresistance ratio and small resistance×surface-area product (less than $100\Omega.\mu m^2$) in order to obtain a high read range and in order to ensure effective heating during the write phase, but without exceeding the breakdown voltage of the tunnel barrier.

To achieve this, the present invention relates to a magnetic memory or logic element with thermally-assisted writing using a field or spin transfer and based on magnetic elements, each comprising:

a magnetic reference layer referred to as the "trapped layer", the magnetization of which is in a fixed direction;

a magnetic storage layer called the "free layer" having a variable magnetization direction and consisting of a layer made of a ferromagnetic material with magnetization in the plane of the layer and magnetically coupled to a magnetization-trapping layer made of an antiferromagnetic material;

a semiconductor or an insulating layer with confined-current-paths sandwiched between the reference layer and the storage layer.

According to the invention, at least one bilayer consisting respectively of an amorphous or quasi-amorphous material and a material having the same structure or the same crystal lattice as the antiferromagnetic layer is placed in the storage layer between the ferromagnetic layer and the antiferromagnetic layer.

Inserting a layer of amorphous or quasi-amorphous material, i.e. a material with no crystallographic orientation or structure or with local crystallographic organisation approximately equal to or less than one nanometre, into the storage layer makes, respectively, the crystal lattices of the tunnel barrier and the antiferromagnetic layer which constitutes the upper layer of the storage layer compatible and, consequently, one achieves the various characteristics mentioned above.

According to the invention, the thickness of the at least one layer made of an amorphous or quasi-amorphous material is 0.15 to 3 nm. The value 0.15 nm is given for information only as a minimum value in order to allow transition between body-centred cubic and face-centred cubic structures. The value 3 nm is also given for information only as a maximum value beyond which the magnetic layers either side of this amorphous or quasi-amorphous layer might be excessively magnetically decoupled if the amorphous layer is non magnetic. If the amorphous layer is magnetic (as, for example, CoFeB), the 3 nm value is also a maximum value so as not to increase the magnetic thickness of the storage layer excessively.

The amorphous or quasi-amorphous material is advantageously selected from the group comprising tantalum (Ta), copper (Cu), ruthenium (Ru), silicon dioxide ($SiO_2$), tantalum oxide (TaO), aluminium oxides ($AlO_x$), zirconium oxides ($ZrO_x$), titanium oxides ($TiO_x$), hafnium oxides ($HfO_x$), tantalum nitride (TaN), titanium nitride (TiN), transition metals Co, Fe or Ni with added boron, zirconium, niobium or hafnium with the total proportion of added elements being 5 to 30% by atomic weight or an alloy of these compounds.

According to the invention, this amorphous or quasi-amorphous material can be deposited by using magnetron sputtering or any other Physical Vapour Deposition (DVD) process.

In one variant of the invention, the amorphous or quasi-amorphous material consists of a heterogeneous metal oxide.

This is, for example, formed by oxidising a fine layer of copper-aluminium alloy ($Al_{1-x}Cu_x$), x being within the range 0.1 to 10%, and, more generally, heterogeneous alloys having the formula $M_y(NO_x)_{1-y}$ where:

M is a transition metal selected from the group comprising nickel, cobalt and iron or a noble metal or an alloy of noble metals such as copper, silver or gold, $NO_x$ is an amorphous or quasi-amorphous oxide of an element selected from the group comprising Si, Ti, Hf, Ta, Mg or a mixture of these oxides; the notation $NO_x$ denotes that the composition of the oxide is close to a stable composition of the corresponding oxide (for example $SiO_2$, $Al_2O_3$, $Ta_2O_5$, $HfO_2$) but with the possible presence of oxygen vacancies.

y is 0.1 to 10%

Advantageously and according to the invention, the antiferromagnetic layers which trap the reference layer and the storage layer respectively are based on a manganese alloy, especially PtMn for the reference layer and IrMn or FeMn for the storage layer.

BRIEF DESCRIPTION OF THE DRAWINGS

The way in which the invention is implemented and its resulting advantages will be made more readily understandable by the description of the following embodiment, given merely by way of example, reference being made to the accompanying drawings.

As stated earlier.

DETAILED DESCRIPTION OF THE INVENTION

Figure 1:
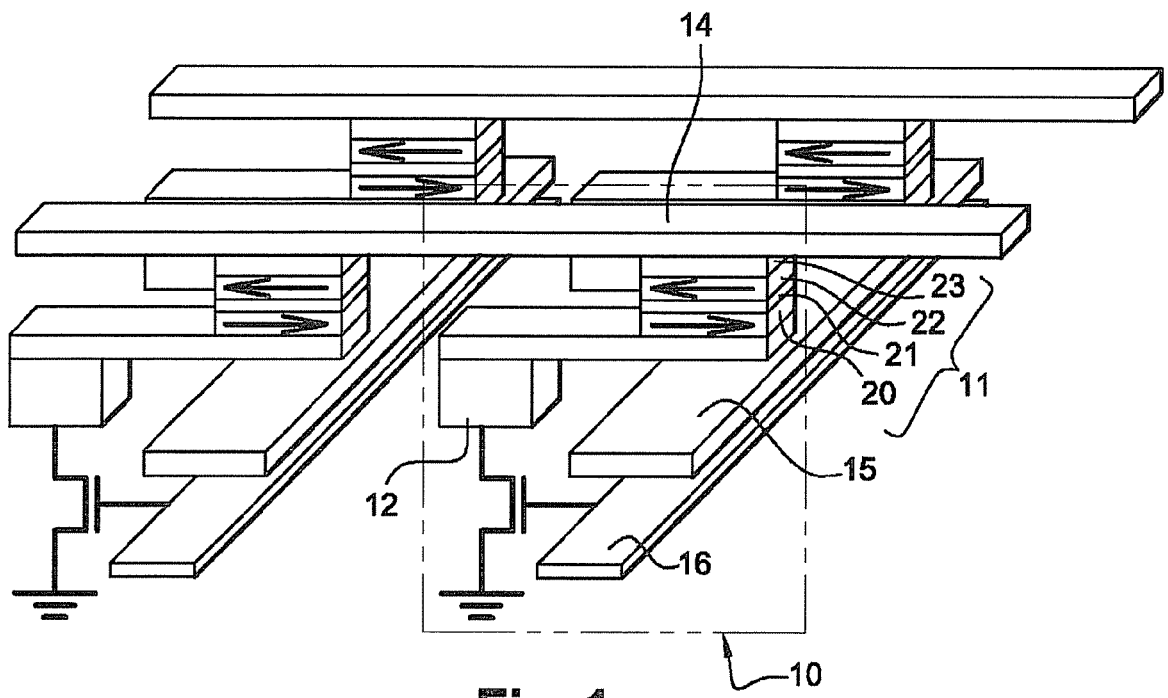
FIG. 1 is a schematic view of the architecture of an FIMS type magnetic memory according to the prior art.
Figure 2:
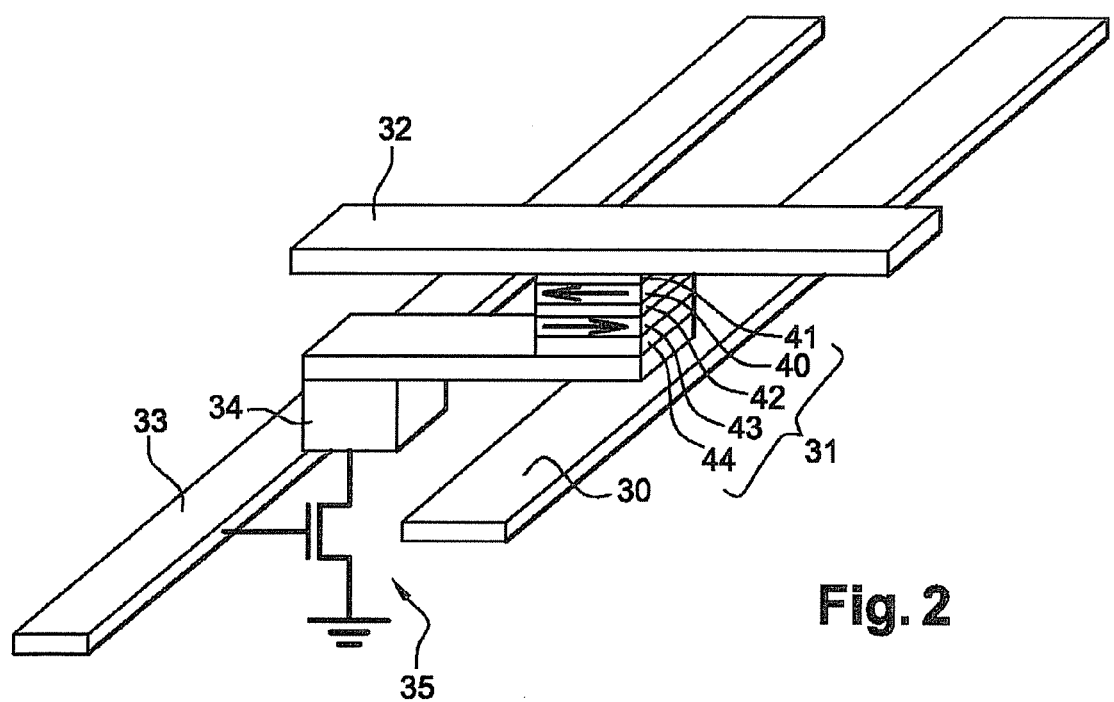
FIG. 2, which is also described above, is a schematic view of a magnetic memory which uses an MRAM with thermally-assisted writing which is also known from the prior art.
Figure 3:
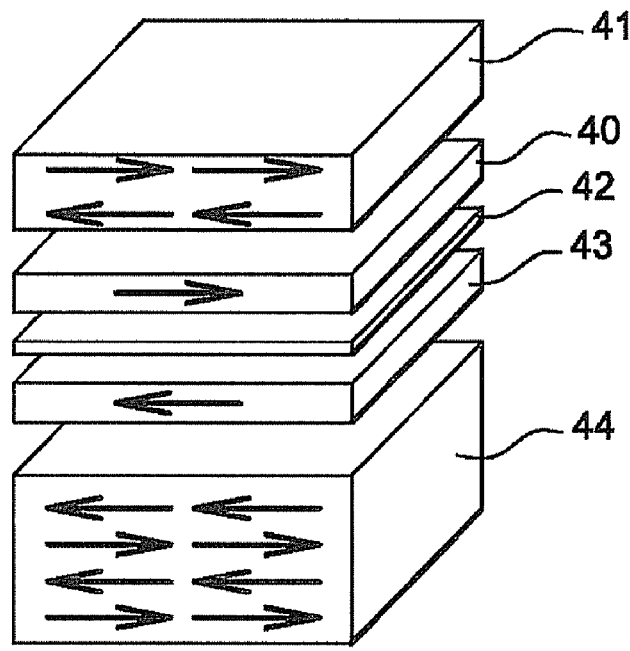
FIG. 3 is a schematic view of a storage cell used in the context of the magnetic memory with thermally-assisted writing shown in FIG. 2 and which is therefore also belonging to the prior art.

The prior art in respect of random-access magnetic memories is described at great length in the preamble to the present invention. This being so and in order to simplify this description, only one storage cell of such magnetic memories will be described in greater detail below.

As already stated, the storage cell fundamentally consists of a magnetic magnetoresistive element, preferably a magnetic tunnel junction. The latter comprises a tunnel barrier (42) selected from the group comprising aluminum oxides $AlO_x$, titanium oxides $TiO_x$ and magnesium oxide MgO.

Alternatively, the layer which separates reference layer (43) from storage layer (40) can be a semiconductor (based for instance on silicon or germanium or GaAs).

It may also consist of a metal/heterogeneous oxide layer such as confined-current-paths layers developed in the context of magnetoresistive read heads for hard disks. The latter consist, for example, of $Al_{1-x}Cu_x$ alloys where x is 0.5 to 10%, which are oxidised to form a layer of amorphous alumina pierced with copper metallised holes.

It is well known that magnetic tunnels junctions are limited in terms of the voltage which can be applied to their terminals because of risk of dielectric breakdown. Consequently, it is necessary to reduce the resistance×surface area (RA) sufficiently to make it possible for an electric current, which is sufficiently high to cause the temperature of the storage layer of the tunnel junction to increase beyond its blocking temperature, to flow through the actual tunnel barrier.

Depending on the nature of the stacks used for the magnetic tunnel junction, the heating-current density required in order to raise the temperature of the magnetic tunnel junction by approximately 150° C. can vary from $10^5$ A/cm$^2$ to $10^7$ A/cm$^2$ depending whether or not there is any thermal barrier and depending on the effectiveness (thermal resistance) of such barriers (this is determined by their thickness and by their thermal conductivity). RA (resistance×surface area) of the order of 1 to 500Ω.μm$^2$ is appropriate for such current densities.

As stated earlier, oxides of aluminium, especially alumina having a thickness of 0.7 to 1.2 nm or magnesium oxide MgO having a thickness of 1.0 to 2.5 nm can be used as a material for the tunnel barrier.

However, in order to obtain high magnetoresistance ratios, typically greater than 100%, it is necessary to use magnesium oxide as a tunnel barrier. It has been demonstrated that these magnetoresistance properties are directly correlated to its body-centred cubic crystal structure (001) and to the identical structure of the ferromagnetic layers which are in contact with said tunnel barrier.

Advantageously, ferromagnetic reference layer (43) located on one of the faces of tunnel barrier (42) opposite the face comprising storage layer (40) consists of a synthetic layer consisting of a stack of two ferromagnetic layers which are antiparallel coupled through a layer of ruthenium, the second ferromagnetic layer being itself trapped by an antiferromagnetic layer typically made of PtMn.

Alternatively, this reference layer may consist of a ferromagnetic layer trapped by an antiferromagnetic layer.

The thickness of the PtMn antiferromagnetic layer which traps the reference layer is relatively large, typically 12 nm to 20 nm, and it has a high blocking temperature.

Similarly, storage layer (40), described below in greater detail in accordance with the invention, is itself trapped by antiferromagnetic layer (41) which in this case is made of IrMn or FeMn and is thinner than the PtMn layer which traps the reference layer. This IrMn or FeMn antiferromagnetic magnetization-trapping layer also has a blocking temperature which is lower than that of the PtMn layer.

When such an IrMn or FeMn antiferromagnetic layer is used, the intensity of the resulting exchange anisotropy field of the storage layer is particularly dependent on the face-centred cubic structure of its crystal lattice and this intensity increases as the organisational level of the crystallographic structure increases. For a given material, the blocking temperature essentially depends on grain-volume size and it can therefore be adapted by modifying the thickness of the layer.

As mentioned in the preamble to the present invention, storage layer (40) consists of a bilayer which combines a layer made of a ferromagnetic material having magnetization in the plane of the layer and in contact with the tunnel barrier and a layer made of an antiferromagnetic material (IrMn or FeMn) which has a moderate or even low blocking temperature, typically, but not imitatively, within the range 120° C. to 220° C. This blocking temperature must be sufficiently high to ensure that, at ambient temperature, i.e. other than at the time of a write, the magnetization of the storage layer is sufficiently trapped to preserve information for a period of several years but nevertheless not too high in order to avoid excessive heating of the magnetic tunnel junction during each write operation, which could cause materials to degrade, cause depolarisation of the magnetization of the reference layer or result in excessively high power consumption. This IrMn (FeMn) and more particularly $Ir_{20}Mn_{80}$ ($Fe_{50}Mn_{50}$) antiferromagnetic layer has a typical thickness of 4 to 15 nm.

Ferromagnetic layer (47) which is part of the storage layer and in contact with tunnel barrier (42) consists, for example, of a material selected from the group comprising permalloy ($Ni_{80}Fe_{20}$), $Co_{90}Fe_{10}$ or any other magnetic alloy containing iron, cobalt, nickel and having a thickness of the order of 1 to 5 nm.

Experience shows that the distribution of structural defects is likely to be significantly dense in magnetic tunnel junctions due to inherent structural incompatibility between the body-centred cubic crystal structure (001) of the MgO tunnel barrier and the adjacent ferromagnetic layers on the one hand and between the face-centred cubic crystal structure (111) of the IrMn antiferromagnetic layer on the other hand. These structural incompatibilities have a direct impact on the magnetoresistance ratio and on the magnetization-trapping, quality of the storage layer due to these differences in crystallographic structure which do not effectively filter electrons as a function of the symmetry of their spin-dependent electronic wave function, relative to the symmetry of the propagation states in the tunnel barrier. Using a structure other than the face-centred cubic structure (111) of the IrMn antiferromagnetic layer results in weaker exchange anisotropy fields and higher coercivity of the storage layer—effects which run counter to the sought-after objective of the present invention.

Figure 4:
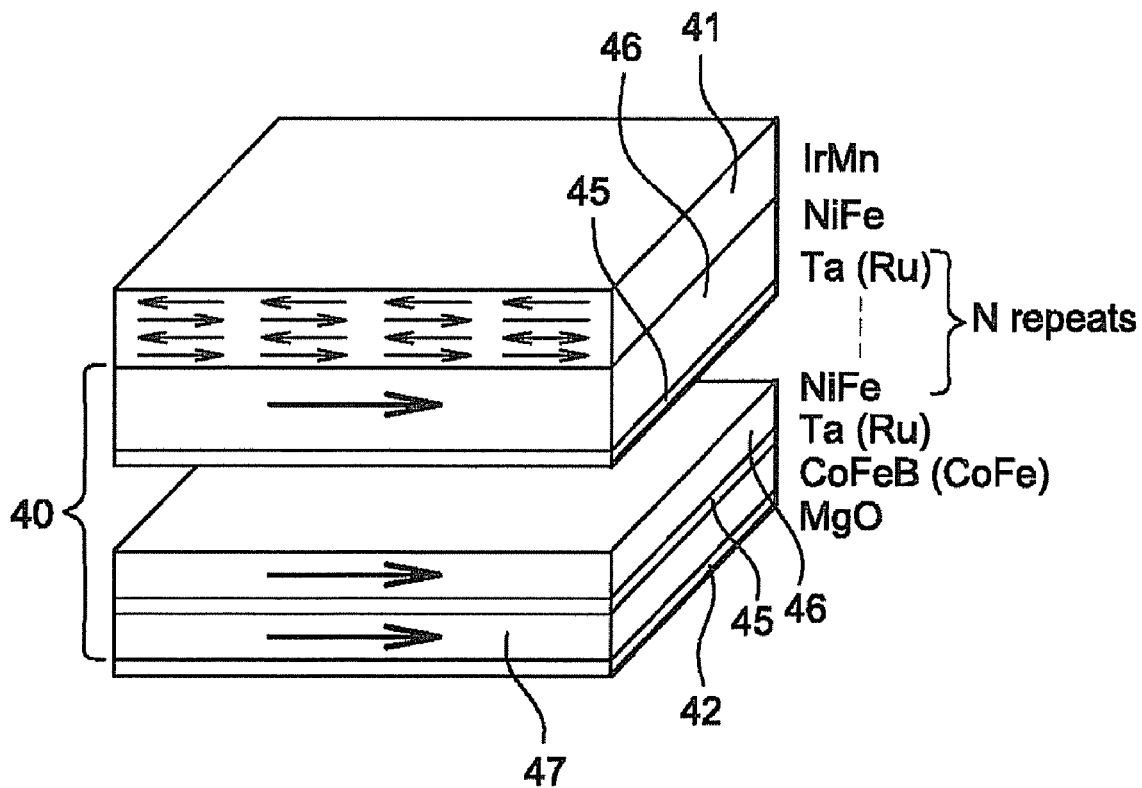
FIG. 4 is a view of a partial storage cell in accordance with the present invention.

According to one essential aspect of the invention and in order to achieve the said results, at least one bilayer, each including a layer of amorphous or quasi-amorphous material as described in relation to FIG. 4, into the bilayer that constitutes the storage layer, i.e. between ferromagnetic layer (47) which is in contact with the tunnel barrier and the IrMn antiferromagnetic layer.

Introducing such layers made of an amorphous or quasi-amorphous material disrupts the local crystallography during the growth process and allows changeover or relaxation from a body-centred cubic type crystalline growth process to a face-centred cubic type crystalline growth process. This being so, the memory of the body-centred cubic crystal structure (001) produced by the first ferromagnetic layer(s) which is/are in contact with the tunnel barrier is destroyed once a layer of amorphous or quasi-amorphous material has been deposited one or more times.

According to the invention, rather than simply depositing an amorphous layer, a bilayer consisting of an amorphous or quasi-amorphous material (45) and a ferromagnetic material with a face-centred cubic crystal structure (46), especially one made of a material consisting of permalloy (NiFe), are deposited.

The number of repeats (N) of this bilayer (amorphous or quasi-amorphous layer and ferromagnetic structure with a face-centred cubic structure) must be as small as possible so that, firstly, the coercive field strength of the storage layer thus constituted is weak and, secondly, heating of said storage layer is effective so as to facilitate write operations.

According to the invention, the thickness of the layer(s) made of an amorphous or quasi-amorphous material is 0.15 to 3 nm. The value 0.15 nm is given for information only as a minimum value in order to allow transition between body-centred cubic and face-centred cubic structures. The value 3 nm is also given for information only as a maximum value beyond which the magnetic layers either side of this amorphous or quasi-amorphous layer night be excessively magnetically decoupled if the amorphous layer is non magnetic. If the amorphous layer is magnetic (as, for example, CoFeB), the 3 nm value is also a maximum value so as not to increase the magnetic thickness of the storage layer excessively.

The amorphous or quasi-amorphous material is advantageously selected from the group comprising tantalum (Ta), copper (Cu), ruthenium (Ru), silicon dioxide ($SiO_2$), tantalum oxide (TaO), aluminium oxides ($AlO_x$), zirconium oxides ($ZrO_x$), titanium oxides ($TiO_x$), hafnium oxides ($HfO_x$), tantalum nitride (TaN), titanium nitride (TiN), transition metals Co, Fe or Ni with added boron, zirconium, niobium or hafnium with the total proportion of added elements being 5 to 30% by atomic weight or an alloy of these compounds.

These layers are deposited by using magnetron sputtering or any other Physical Vapour Deposition (DVD) process. Oxides or nitrides deposited using these methods generally incorporate large amounts of oxygen or nitrogen vacancies so that the resistance×surface-area product introduced by the layer of amorphous or quasi-amorphous material is small compared with the tunnel barrier's resistance×surface-area product. As for metallic layers (such as CoFeB for instance), these have a very small resistance×surface-area product compared with the tunnel barrier's resistance×surface-area product.

The layers of amorphous or quasi-amorphous material thus produced may also consist of a combination of the above-mentioned materials. One can, for example, use a 0.3 nm thick $AlZrO_x$ compound or a multilayer-type combination of these materials, such as $AlO_x$ 0.2 nm/$TaO_x$ 0.2 nm for instance.

In a second embodiment of the invention, it is also possible to insert heterogeneous metal oxides in the form of thin layers obtained, for example, by oxidising thin layers of a compound such as $Al_{1-x}Cu_x$, x being within the range 0.1 to 10%. This type of layer was developed for magnetoresistive heads which use confined current paths. Because aluminium's affinity for oxygen is much greater than copper's, after oxidation the layers consist of $AlO_x$ layers pierced by copper metallised holes having a relatively well-controlled density and size. The density and the size of these holes are determined by the quantity of copper mixed with the aluminium during the AlCu alloy deposition phase prior to oxidation and by the oxidation conditions (pressure, temperature during oxidation).

More generally speaking, one can use any form of heterogeneous alloy having the general formula: $M_y(NO_x)_{1-y}$ where M is a transition metal selected from the group comprising nickel, cobalt and iron or a noble metal or an alloy of several noble metals such as copper, silver or gold. $NO_x$ then denotes an amorphous or quasi-amorphous oxide such as $SiO_x$, $TiO_x$, $HfO_x$, $TaO_x$ and MgO, or a mixture of these oxides.

These heterogeneous alloys are produced by initially depositing a thin $M_yN_{1-y}$ type layer and then oxidising said layer by natural or plasma oxidation. Because the affinity for oxygen of species N (Si, Ti, Hf, Ta, Mg) is greater than that of metals M, there is a separation phase during oxidation so that oxidation results in the formation of an $NO_x$ matrix comprising holes metallised with material M. These holes can also be partially oxidised, but to a lesser extent than the absorbing matrix.

The typical thickness of alloy to be deposited before oxidation is 0.15 nm to 2 nm. One can select the thickness of these layers by trial and error so as to obtain a sufficient thickness to allow structural change of the layer in question but not excessive thickness in order to ensure that the magnetic layers located either side of said layer in question remain sufficiently ferromagnetically coupled. In other words, the magnetic storage layer which is in contact with the tunnel barrier must retain an exchange field which is significantly higher than its coercivity under normal temperature conditions, i.e. other than at the time of a read. This criterion makes it possible, when a write operation has been performed, to ensure a single stable state of the storage layer under the normal temperature conditions in which the memory is used.

If metal M is magnetic (Fe, Co, Ni or an alloy based on these metals), the metallised holes will be magnetic and there will be strong relative magnetic coupling between layers M through the $NO_x$ layers. This makes it possible to use relatively thicker $NO_x$ layers which are typically 0.6 to 2 nm thick. However, if metal M is a noble metal, interlayer coupling through the $NO_x$ layer decreases rapidly as the thickness of said $NO_x$ layer increases. In this case, one must use thinner layers, typically 0.15 to 1 nm in order to maintain sufficient magnetic coupling through said layers.

In the notation $NO_x$, x represents a composition close to that of a stable oxide of N. For example, if N represents aluminium, $AlO_x$ represents a composition close to $Al_2O_3$. However, in this type of oxide there are always a few oxygen vacancies and this means that the composition is never precisely the ideal composition of the perfectly stochiometric oxide.

As in the first embodiment, it is also possible to insert several layers (typically as many as 2 or 3) of such heterogeneous alloys in the stack whilst nevertheless maintaining the required thickness in order to preserve good magnetic coherence of the entire storage layer and appropriate exchange field properties. In other words, the various layers which make up the storage layer must be sufficiently magnetically coupled to respond as a single magnetic layer, the coercivity of which is less than the exchange anisotropy field, the latter typically equaling several dozen to several hundred oersteds in normal mode, i.e. other than at the time of a write.

In a third embodiment of the invention, the layer of amorphous or quasi-amorphous material inserted into the storage layer can be obtained by a natural or plasma oxidation stage which takes place during growth of the upper magnetic layer of the tunnel junction. For example, one can deposit, on the MgO tunnel barrier, a first 2 nm thick layer of CoFeB or CoFe with a body-centred cubic crystal lattice (iron concentration in excess of 30% and preferably around 50%). The structure obtained is then exposed to the atmosphere or oxygen so as to naturally oxidise the surface of the CoFeB or CoFe in order to obtain formation of a layer of $CoFeBO_x$ or $CoFeO_x$.

After this operation, the upper layer can be grown using a face-centred cubic type magnetic material such as CoFe having an iron concentration less than 30%, for example, $Co_{90}Fe_x$ or NiFe.

This technique for implementing a nanometric oxide layer from the oxidation surface of a previously deposited magnetic layer is identical to that already developed in the context of producing specular spin valves (see the following publication for example: *Enhancement of MR ratios using thin oxide layers in PtMn and α-Fe₂O₃-based spin valves*, Sakakima. H., Satomi. M., Sugita. Y., Kawawake, Y., Journal of Magnetism and Magnetic Materials, 210(1), p. 20-24, February 2000). The oxide layers thus formed are relatively thin, quasi-amorphous, approximately 0.5 nm thick and have a relatively high hole density. This makes it possible to obtain strong ferromagnetic coupling through such layers. They are therefore very suitable for the present invention.

In the context of this embodiment, it is also possible to use several of these nanometric oxide layers in the stack which constitutes the storage layer and hence between the tunnel barrier and the antiferromagnetic layer which traps the magnetization of the storage layer in normal mode, i.e. other than at the time of a read.

The memories produced using the magnetic tunnel junction in accordance with the invention make it possible to achieve high magnetoresistance ratios, chiefly due to the body-centred cubic structure of the MgO tunnel barrier and the magnetic layers which are in contact with said barrier, and a high exchange anisotropy field with a weakly coercive storage layer (with the antiferromagnetic magnetization-trapping layer having a face-centred cubic crystal structure), both these being needed in order to produce a storage layer having a preferred exchange anisotropy field in the context of magnetic memories with thermally-assisted writing.

As stated above, the insertion of one or more ultra thin layers of an amorphous or quasi-amorphous material makes it possible to decouple the two crystal structures. For illustrative purposes, the present invention was tried out using various storage-layer configurations.
1. Simple, conventional storage layer based on CoFeB
2. Storage layer consisting of a CoFeB/NiFe/IrMn trilayer
3. Storage layer consisting of a CoFeB/Ta (0.2 nm)/NiFe/IrMn stack
4. Storage layer consisting of a CoFeB/Ta (0.5 nm)/NiFe/IrMn stack The experimental values obtained for Tunnel Magnetoresistance (TMR), the surface-area×resistance product (R.A.), exchange anisotropy field Hex and coercive field strength $H_c$ of the storage layer are shown in the Table below.

|  | 1 | 2 | 3 | 4 |
|---|---|---|---|---|
| TMR | 160% | 60% | 130% | 140% |
| R.A. in $\Omega \cdot \mu m^2$ | 60 | 100 | 100 | 85 |
| $H_C$ | 12 | 30 | 20 | 12 |

-continued

|  | 1 | 2 | 3 | 4 |
|---|---|---|---|---|
| in oersteds $H_{ex}$ in oersteds | no exchange | 180 | 140 | 5 |

Note that, with a conventional CoFeB layer (example 1), the TMR value obtained is approximately 160% for a RA product of 60Ω.μm². These values are considered to be a benchmark for good magnetoresistive properties in a textured CoFeB/MgO/CoFeB stack of a magnetic tunnel junction for a magnetic memory. The coercive field strength of the upper CoFeB layer is also relatively weak.

In the case of the second proposed stack (CoFeB/NiFe/IrMn) (example 2) for the storage layer, an NiFe layer is added in order to optimise the exchange anisotropy field with the IrMn antiferromagnetic layer. Adding this IrMn layer on the ferromagnetic layer causes a significant drop in magnetoresistance to approximately half value of the sample No. 1, although the exchange anisotropy field remains high (140 oersteds).

Inserting an ultra-thin layer of quasi-amorphous tantalum material (0.2 nm thick) between the CoFeB magnetic layer and the NiFe layer (example 3) makes it possible to improve the TMR value up to approximately 130% whilst retaining the same exchange anisotropy field value.

Increasing the thickness of the tantalum layer makes it possible to improve the TMR value further still until, typically, the benchmark value (example 1) is achieved, but in this case the exchange anisotropy field on the upper CoFeB layer drops drastically.

In other words, inserting a very thin layer of an amorphous or quasi-amorphous material between the ferromagnetic layer which is in contact with the tunnel barrier and one of the layers which is in contact with the IrMn antiferromagnetic layer makes it possible to achieve a high TMR value and a high exchange anisotropy magnetic field. However, if the thickness of this layer is too large, the ferromagnetic layers are completely decoupled and the exchange anisotropy acting on the upper CoFeB layer then disappears.

The invention claimed is:

1. A magnetic element with thermally-assisted writing using a field or spin transfer, each comprising:
   a magnetic reference layer referred to as the "trapped layer", the magnetization of which is in a fixed direction;
   a magnetic storage layer called the "free layer" having a variable magnetization direction and consisting of a layer made of a ferromagnetic material with magnetization in the plane of the layer and magnetically coupled to a magnetization-trapping layer made of an antiferromagnetic material; and
   a semiconductor or an insulating layer with confined-current-paths sandwiched between the reference layer and the storage layer;
   wherein at least one bilayer consisting respectively of an amorphous or quasi-amorphous material and a material having the same structure or the same crystal lattice as the antiferromagnetic layer is present in the storage layer between the ferromagnetic layer, which is in contact with the semiconductor or insulating layer with confined-current-paths, and the antiferromagnetic layer.

2. A magnetic element with thermally-assisted writing using a field or spin transfer as claimed in claim 1, wherein the thickness of the at least one layer made of an amorphous or quasi-amorphous material is 0.15 to 2 nm.

3. A magnetic element with thermally-assisted writing using a field or spin transfer as claimed in claim 1, wherein the amorphous or quasi-amorphous material is selected from the group comprising tantalum (Ta), ruthenium (Ru), silicon dioxide ($SiO_2$), tantalum oxide (TaO), aluminium oxides ($AlO_x$), zirconium oxides ($ZrO_x$), titanium oxides ($TiO_x$), hafnium oxides ($HfO_x$), tantalum nitride (TaN), titanium nitride (TiN), transition metals Co, Fe or Ni with added boron, zirconium, niobium or hafnium with the total proportion of added elements being 5 to 30% by atomic weight or an alloy of these compounds.

4. A magnetic element with thermally-assisted writing using a field or spin transfer as claimed in claim 1, wherein the layer of amorphous or quasi-amorphous material is deposited by magnetron sputtering or any other physical vapor deposition (PVD) process.

5. A magnetic element with thermally-assisted writing using a field or spin transfer as claimed in claim 1, wherein the amorphous or quasi-amorphous material consists of a heterogeneous metal oxide.

6. A magnetic element with thermally-assisted writing using a field or spin transfer as claimed in claim 5, wherein the heterogeneous metal oxide has a general formula $M_y(NO_x)_{1-y}$, wherein
   M is a transition metal selected from the group comprising nickel, cobalt and iron or a noble metal or an alloy of noble metals such as copper, silver or gold,
   $NO_x$ is an amorphous or quasi-amorphous oxide of an element N selected from the group comprising Si, Ti, Hf, Ta, Mg or a mixture of these oxides, and
   y is 0.1 to 10%.

7. A magnetic element with thermally-assisted writing using a field or spin transfer as claimed in claim 5, wherein the heterogeneous metal oxide has a general formula ($Al_{1-x}Cu_x$), when x varies from 0.1 to 10%.

8. A magnetic element with thermally-assisted writing using a field or spin transfer as claimed in claim 1, wherein the antiferromagnetic layers which, respectively trap reference layer and storage layer, are based on a manganese alloy, for the reference layer and IrMn or FeMn for the storage layer.

9. A magnetic memory with thermally-assisted writing, each storage cell of which consists of a magnetic element as claimed in claim 1.

10. A logic element with thermally-assisted writing consisting of a magnetic element as claimed in claim 1.

11. The magnetic element with thermally-assisted writing using a field or spin transfer as claimed in claim 8, wherein the manganese alloy is PtMn.

* * * * *